(12) United States Patent
Ishida et al.

(10) Patent No.: US 7,684,944 B2
(45) Date of Patent: Mar. 23, 2010

(54) CALIBRATION APPARATUS, CALIBRATION METHOD, AND TESTING APPARATUS

(75) Inventors: Masahiro Ishida, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 104 days.

(21) Appl. No.: 11/582,143

(22) Filed: Oct. 17, 2006

(65) Prior Publication Data

US 2008/0091371 A1    Apr. 17, 2008

(51) Int. Cl.
*G06F 19/00*    (2006.01)
(52) U.S. Cl. .................................................. 702/85
(58) Field of Classification Search .................... 702/85
See application file for complete search history.

(56) References Cited

U.S. PATENT DOCUMENTS

2004/0062301 A1    4/2004    Yamaguchi et al.

FOREIGN PATENT DOCUMENTS

| JP | 62-148882 A | 7/1987 |
| JP | 2001-166007 A | 6/2001 |
| JP | 2006-227009 A | 8/2006 |

OTHER PUBLICATIONS

Jingo Nakanishi, A Wide Lock-in Range PLL using Self-Calibrating Technique for Processors, p. 285-288, IEEE, 2005.*
Keith A. Jenkins, Anup P. Jose, and David F. Heidel, An On-chip Jitter Measurement Circuit with Sub-picosecond Resolution, Proceedings of ESSCIRC 2005, 31st European Solid-State Circuits Conference, Grenoble, France Sep. 12-16, 2005, p. 157-160.*
International Search Report issued in International Application No. PCT/JP2007/069869 mailed on Dec. 18, 2007, 10 pages.

* cited by examiner

*Primary Examiner*—Tung S Lau
(74) *Attorney, Agent, or Firm*—Osha • Liang LLP

(57) ABSTRACT

There is provided a calibration apparatus that calibrates a jitter measuring circuit for outputting a jitter measuring signal with a level according to an amount of jitter in an input signal based on the input signal and a delay signal obtained by delaying the input signal by means of a variable delay circuit. The calibration apparatus includes a delay control section that sequentially sets a first delay amount and a second delay amount in the variable delay circuit and a gain computing section that computes gain in the jitter measuring circuit based on the jitter measuring signal respectively output from the jitter measuring circuit for the first delay amount and the second delay amount.

8 Claims, 12 Drawing Sheets

CALIBRATION APPARATUS, CALIBRATION METHOD, AND TESTING APPARATUS

BACKGROUND

1. Field of the Invention

The present invention relates to a calibration apparatus, a calibration method, and a testing apparatus. More particularly, the present invention relates to a calibration apparatus that calibrates a jitter measuring circuit for measuring a jitter in an input signal.

2. Related Art

There is considered a circuit for measuring a jitter in an on-chip mode as a circuit for measuring a jitter. For example, this circuit measures a jitter in a high frequency signal generated from the inside of chip, and converts jitter amplitude of the measured signal into voltage magnitude, in order to output the voltage magnitude to the outside of chip. It is possible to detect a jitter value outside the chip by dividing the voltage magnitude by jitter output gain of the jitter measuring circuit.

Jitter output gain of the jitter measuring circuit can use a designed value based on a circuit design. Moreover, as another method, there is also considered a method for supplying a signal having a known jitter from the outside of chip to the jitter measuring circuit and measuring output magnitude of the jitter measuring circuit.

However, as a process of manufacturing a semiconductor miniaturizes, characteristics of circuit elements such as a transistor, a resistor, capacitance, or the like in the jitter measuring circuit largely fluctuate according to the variation of process. For this reason, real jitter output gain has a large error for the designed value.

Moreover, in case of a method of inputting a signal having a known jitter from the outside of chip, it is necessary to input a signal having frequency equal to a high frequency signal on chip from the outside so that a characteristic of the jitter measuring circuit is equal to that when measuring a high frequency signal on chip. However, it is difficult to supply, e.g., a high frequency signal around several GHz from input pins of the chip into the chip.

Moreover, in this case, since the quality of high frequency signal easily degrades, jitter amplitude of a signal being input into the jitter measuring circuit is not equal to jitter amplitude of a signal injected from the outside of chip. For this reason, since jitter amplitude of a signal being really input into the jitter measuring circuit becomes uncertain, it is difficult to obtain jitter output gain with high precision.

Moreover, although jitter output gain can be obtained with high precision when a high frequency signal is input into the jitter measuring circuit without degrading signal quality, there is a problem that this method requires a great deal of design cost.

SUMMARY

Therefore, it is an advantage of some aspects of the present invention to provide a calibration apparatus, a calibration method, and a testing apparatus that can solve the foregoing problems. The above and other advantages can be achieved by combinations described in the independent claims. The dependent claims define further advantageous and exemplary combinations of the present invention.

That is, according to the first aspect of the present invention, there is provided a calibration apparatus that calibrates a jitter measuring circuit for outputting a jitter measuring signal with a level according to an amount of jitter in an input signal based on the input signal and a delay signal obtained by delaying the input signal by means of a variable delay circuit. The calibration apparatus includes: a delay control section that sequentially sets a first delay amount and a second delay amount in the variable delay circuit; and a gain computing section that computes gain in the jitter measuring circuit based on the jitter measuring signal respectively output from the jitter measuring circuit for the first delay amount and the second delay amount.

According to the second aspect of the present invention, there is provided a calibration apparatus for calibrating a jitter measuring circuit that is provided inside a semiconductor package equal to a circuit under test and outputs a jitter measuring signal with a level according to a jitter amount of a measured signal based on the measured signal output from the circuit under test and a delay signal obtained by delaying the measured signal by means of a variable delay circuit. The calibration apparatus includes: a delay control section that sequentially sets a first delay amount and a second delay amount in the variable delay circuit; and a gain computing section that computes gain in the jitter measuring circuit based on the jitter measuring signal respectively output from the jitter measuring circuit for the first delay amount and the second delay amount.

According to the third aspect of the present invention, there is provided a calibration method for calibrating a jitter measuring circuit that outputs a jitter measuring signal with a level according to an amount of jitter in an input signal based on the input signal and a delay signal obtained by delaying the input signal by means of a variable delay circuit. The calibration method includes: sequentially setting a first delay amount and a second delay amount in the variable delay circuit; and computing gain in the jitter measuring circuit based on the jitter measuring signal respectively output from the jitter measuring circuit for the first delay amount and the second delay amount.

According to the fourth aspect of the present invention, there is provided a testing apparatus that tests a circuit under test provided inside a semiconductor package equal to a jitter measuring circuit. The jitter measuring circuit outputs a jitter measuring signal with a level according to a jitter amount of a measured signal based on the measured signal output from the circuit under test and a delay signal obtained by delaying the measured signal by means of a variable delay circuit. The testing apparatus includes: a calibration apparatus that previously calibrates the jitter measuring circuit; and a deciding section that decides the good or bad of the device under test based on the jitter measuring signal, and the calibration apparatus includes: a delay control section that sequentially sets a first delay amount and a second delay amount in the variable delay circuit; and a gain computing section that computes gain in the jitter measuring circuit based on the jitter measuring signal respectively output from the jitter measuring circuit for the first delay amount and the second delay amount.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
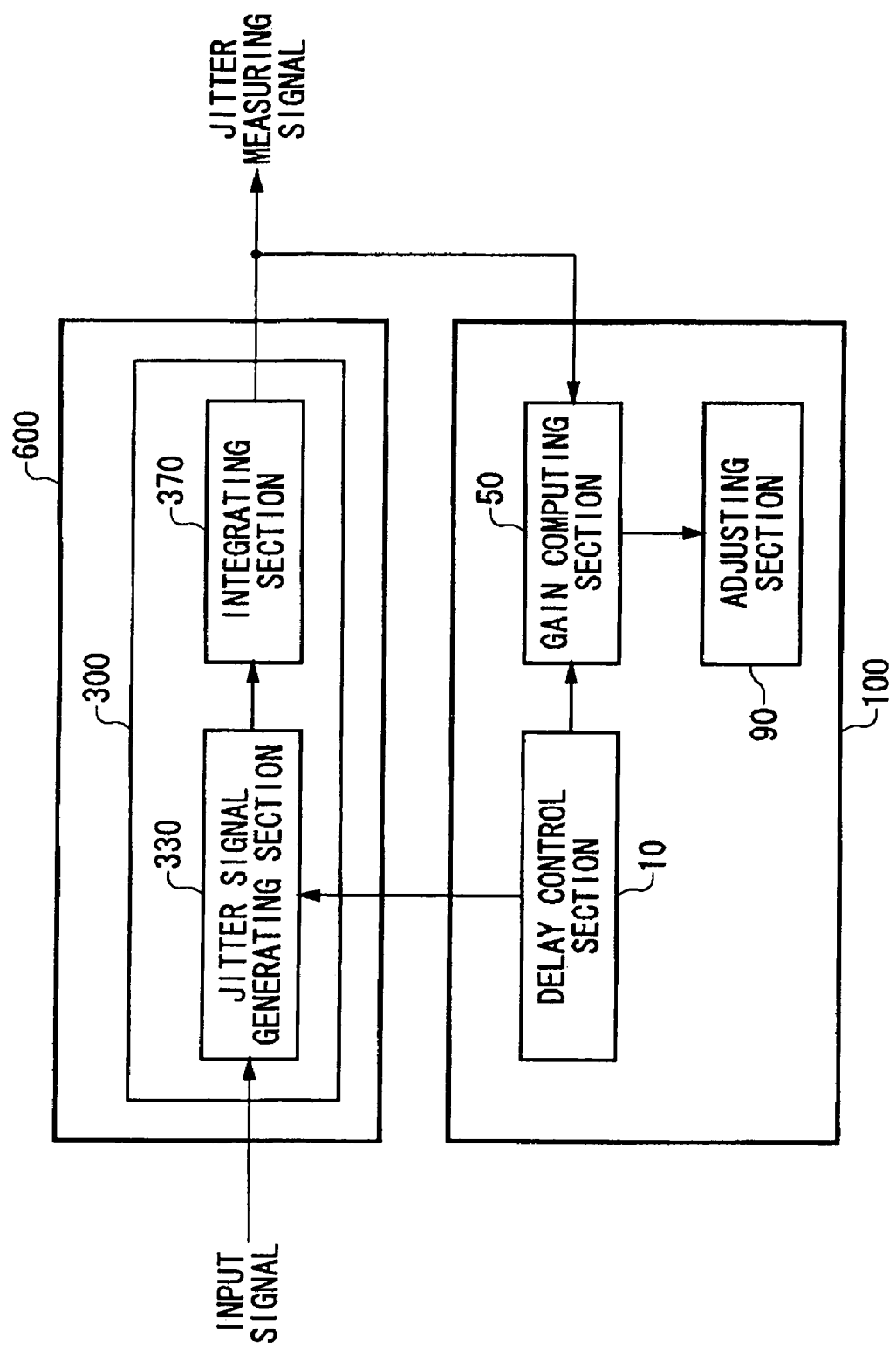
FIG. 1 is a view exemplary showing a configuration of a calibration apparatus according to an embodiment of the present invention.

FIG. 1 is a view exemplary showing a configuration of a calibration apparatus 100 according to an embodiment of the present invention. The calibration apparatus 100 calibrates a jitter measuring circuit 300. Here, the jitter measuring circuit 300 is a circuit that measures amplitude (a jitter amount) of a jitter included in an input signal from a circuit under test such as a semiconductor circuit and outputs a jitter measuring signal according to this jitter amount.

The jitter measuring circuit 300 includes a jitter signal generating section 330 and an integrating section 370. The jitter signal generating section 330 and the integrating section 370 are provided inside the same semiconductor package 600. The semiconductor package 600 is formed of a material such as resin for insulating an inside from an outside in order to protect an inside circuit. Moreover, signals are transmitted between the inside and the outside via terminals provided in the semiconductor package 600.

The jitter signal generating section 330 generates a jitter signal of which duration of at least one of High logic and Low logic changes according to a jitter in an input signal based on the input signal and a delay signal obtained by delaying the input signal by means of a variable delay circuit. For example, the jitter signal generating section 330 generates a jitter signal that is substantially synchronized with the input signal and of which a pulse width in each period changes in response to each of rising edge timings of the input signal.

Figure 2:
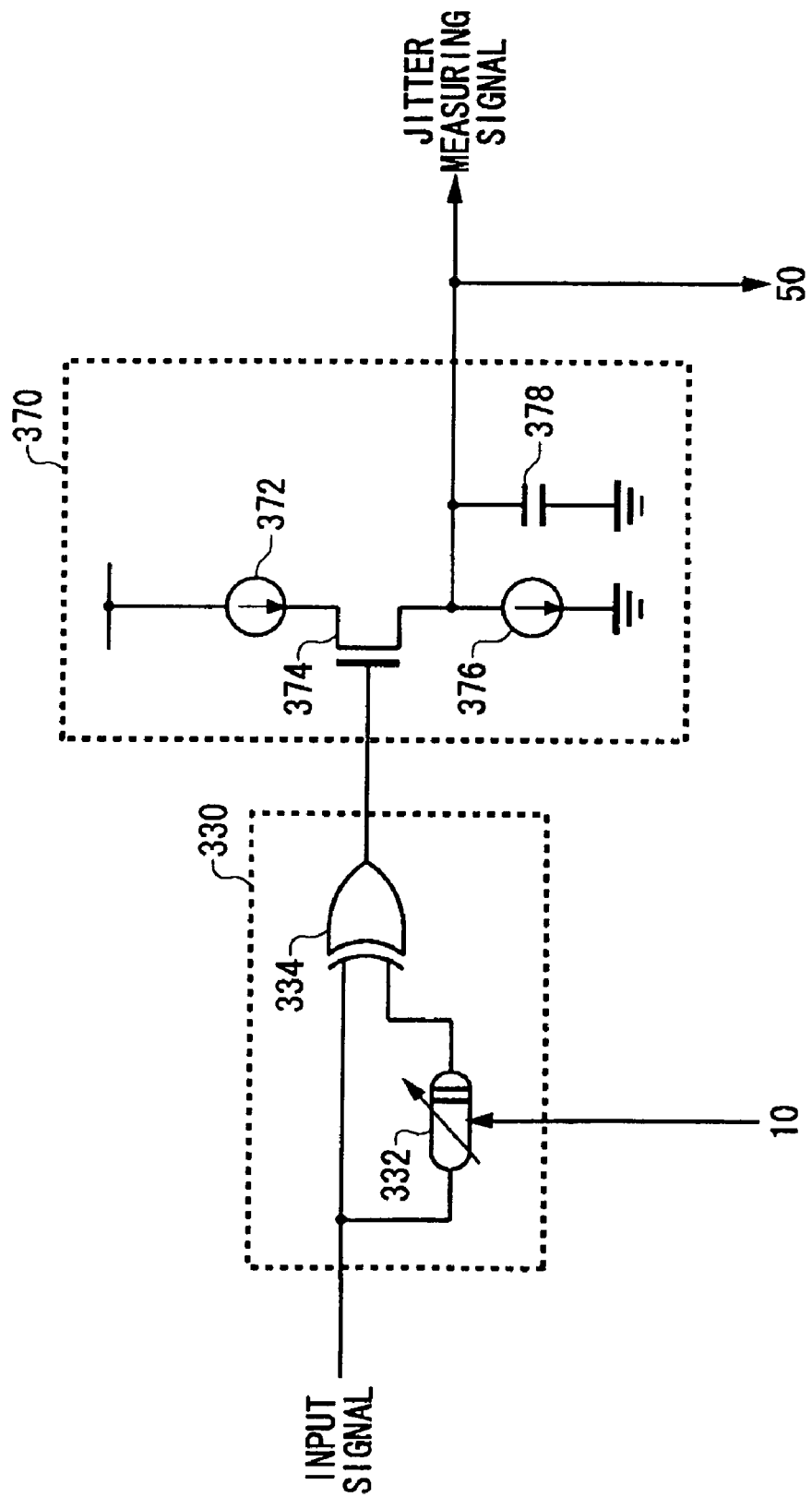
FIG. 2 is a view exemplary showing a configuration of a jitter measuring circuit.

This jitter signal can be generated from a circuit for outputting a pulse with a predetermined width every rising edge in the input signal, for example, as shown in FIG. 2. In this case, duration of Low logic in each period of the jitter signal changes according to each of rising edge timings of the input signal.

The integrating section 370 integrates a jitter signal, and outputs a jitter measuring signal with a level according to an amount of jitter in the input signal. For example, the integrating section 370 may be a charge pump that charges and discharges a capacitor according to times by which the jitter signal shows High logic and Low logic. As described above, since a time by which High logic or Low logic lasts in each period of the jitter signal changes according to an amount of jitter in the input signal, a level of the jitter measuring signal becomes the level according to the amount of jitter in the input signal. For example, it is possible to detect a timing jitter at a rising edge of an input signal by sampling a level of a jitter measuring signal according to the rising edge of the input signal.

Moreover, calibration for the jitter measuring circuit 300 means to measure a ratio of a signal level of a jitter measuring signal to a jitter amount included in an input signal for the jitter measuring circuit 300, that is, to measure jitter output gain.

The calibration apparatus 100 includes a delay control section 10, a gain computing section 50, and an adjusting section 90. The calibration apparatus 100 may be provided outside the semiconductor package 600. The delay control section 10 sequentially sets a first delay amount and a second delay amount in the variable delay circuit in the jitter signal generating section 330. At this time, it is preferable that the calibration apparatus 100 inputs an input signal of which a jitter is substantially zero into the jitter measuring circuit 300. The calibration apparatus 100 may further include a configuration for generating this input signal and inputting the input signal into the jitter measuring circuit 300. In this case, it is preferable that a configuration for generating an input signal without a jitter is provided inside the semiconductor package 600.

The jitter signal generating section 330 sequentially outputs the jitter signals according to the sequentially set first delay amount and second delay amount. For example, the jitter signal generating section 330 sets the first delay amount, and sets the second delay amount after the gain computing section 50 has measured the jitter measuring signal for a time for which gain can be computed.

When a delay amount in the variable delay circuit is changed, at least one of duration of High logic or Low logic changes in each period of the jitter signal. In other words, it is possible to generate a jitter signal equal to that when input signals with the changed jitter amount are sequentially input into the jitter measuring circuit 300 by changing the delay amount in the variable delay circuit.

The gain computing section 50 computes gain in the jitter measuring circuit 300 based on the jitter measuring signals respectively output from the integrating section 370 for the first delay amount and the second delay amount. For example, the gain computing section 50 may compute gain in the integrating section 370 of the jitter measuring circuit 300 based on a ratio between a difference between the first delay amount and the second delay amount and a difference between the levels of the jitter measuring signals.

The gain computing section 50 may be informed of the first delay amount and the second delay amount from the delay control section 10. In this case, the delay control section 10 may send the first delay setting signal to be supplied to the jitter signal generating section 330 in order to set the first delay amount and the second delay setting signal to be supplied to the jitter signal generating section 330 in order to set the second delay amount, to the gain computing section 50. The delay control section 10 may use a value of the first delay setting signal and a value of the second delay setting signal as the first delay amount and the second delay amount.

Moreover, the gain computing section 50 may measure a real delay amount in this variable delay circuit when the first delay setting signal and the second delay setting signal are set in the variable delay circuit of the jitter signal generating section 330, and detect the first delay amount and the second delay amount. It will be below described about configurations and operations of the jitter measuring circuit 300 and the calibration apparatus 100 in this case with reference to FIGS. 7 and 8.

Moreover, the gain computing section 50 may use, as the difference between the levels of the jitter measuring signals, a difference between an inclination of an envelope curve of a waveform of a jitter measuring signal when the first delay amount has been set and an inclination of an envelope curve of a waveform of a jitter measuring signal when the second delay amount has been set. It is possible to compute gain in the jitter measuring circuit 300 by dividing the difference between the inclinations of the envelope curves by the difference between the delay amounts.

The adjusting section 90 may adjust the jitter measuring circuit 300 based on the gain computed from the gain computing section 50. For example, the adjusting section 90 may adjust the jitter measuring circuit 300 so that the gain of the jitter measuring circuit 300 becomes a predetermined value. In this case, the adjusting section 90 may adjust at least one of a charging current and a discharging current in the integrating section 370.

Moreover, the adjusting section 90 may inform the jitter measuring circuit 300 of the computed gain. The jitter measuring circuit 300 may further include a register for storing the informed gain. An outside apparatus can compute an amount of jitter in an input signal by receiving the jitter measuring signal and this gain from the jitter measuring circuit 300.

FIG. 2 is a view exemplary showing a configuration of the jitter measuring circuit 300. The jitter signal generating section 330 in the present example is a pulse generator that outputs a pulse with a predetermined pulse width according to an edge of an input signal.

The jitter signal generating section 330 has a variable delay circuit 332 and an exclusive OR circuit 334. The variable delay circuit 332 delays the input signal by a delay amount according to pulse width W of a pulse output from the jitter signal generating section 330. The exclusive OR circuit 334 outputs an exclusive OR of the input signal and a signal output from the variable delay circuit 332 as a jitter signal. However, a configuration of the jitter signal generating section 330 is not limited to this configuration. For example, the jitter signal generating section 330 can take a configuration including an AND circuit or the like.

The integrating section 370 demodulates a timing jitter in the input signal by integrating the jitter signal output from the jitter signal generating section 330. For example, the integrating section 370 outputs a jitter measuring signal of which a signal level increases at a predetermined increasing rate while the jitter signal output from the jitter signal generating section 330 shows High logic and of which the signal level decreases at a predetermined decreasing rate while this jitter signal shows Low logic.

By such a configuration and an operation, the integrating section 370 can demodulate a timing jitter in an input signal. However, a configuration and an operation of the integrating section 370 are not limited to the above-described example. A configuration and an operation of the integrating section 370 may be a configuration and an operation capable of demodulating a timing jitter in an input signal.

The integrating section 370 in the present example has a source side current source 372, a sink side current source 376, a capacitor 378, and a charge and discharge control section 374. The source side current source 372 generates a source current prescribing the above-described increasing rate of the jitter measuring signal, and the sink side current source 376 generates a sink current prescribing the above-described decreasing rate of the jitter measuring signal.

The capacitor 378 is charged and discharged by the source side current source 372 and the sink side current source 376 in order to generate a voltage level of the jitter measuring signal. Moreover, the charge and discharge control section 374 charges the capacitor with an electric current obtained by subtracting the sink current from the source current while the jitter signal shows High logic and discharges the capacitor with the sink current while the jitter signal shows Low logic.

By such a configuration, it is possible to generate a jitter measuring signal obtained by demodulating a timing jitter in an input signal.

As described in FIG. 1, the delay control section 10 sequentially supplies the first delay setting signal and the second delay setting signal to the variable delay circuit 332. In this way, a delay amount in the variable delay circuit 332 is sequentially set to the first delay amount and the second delay amount. When, the gain computing section 50 may measure an inclination of an envelope curve of a jitter measuring signal output from the integrating section 370 when the delay amount in the variable delay circuit 332 is set to the first delay amount and an inclination of an envelope curve of a jitter measuring signal output from the integrating section 370 when the delay amount in the variable delay circuit 332 is set to the second delay amount.

Figure 3:
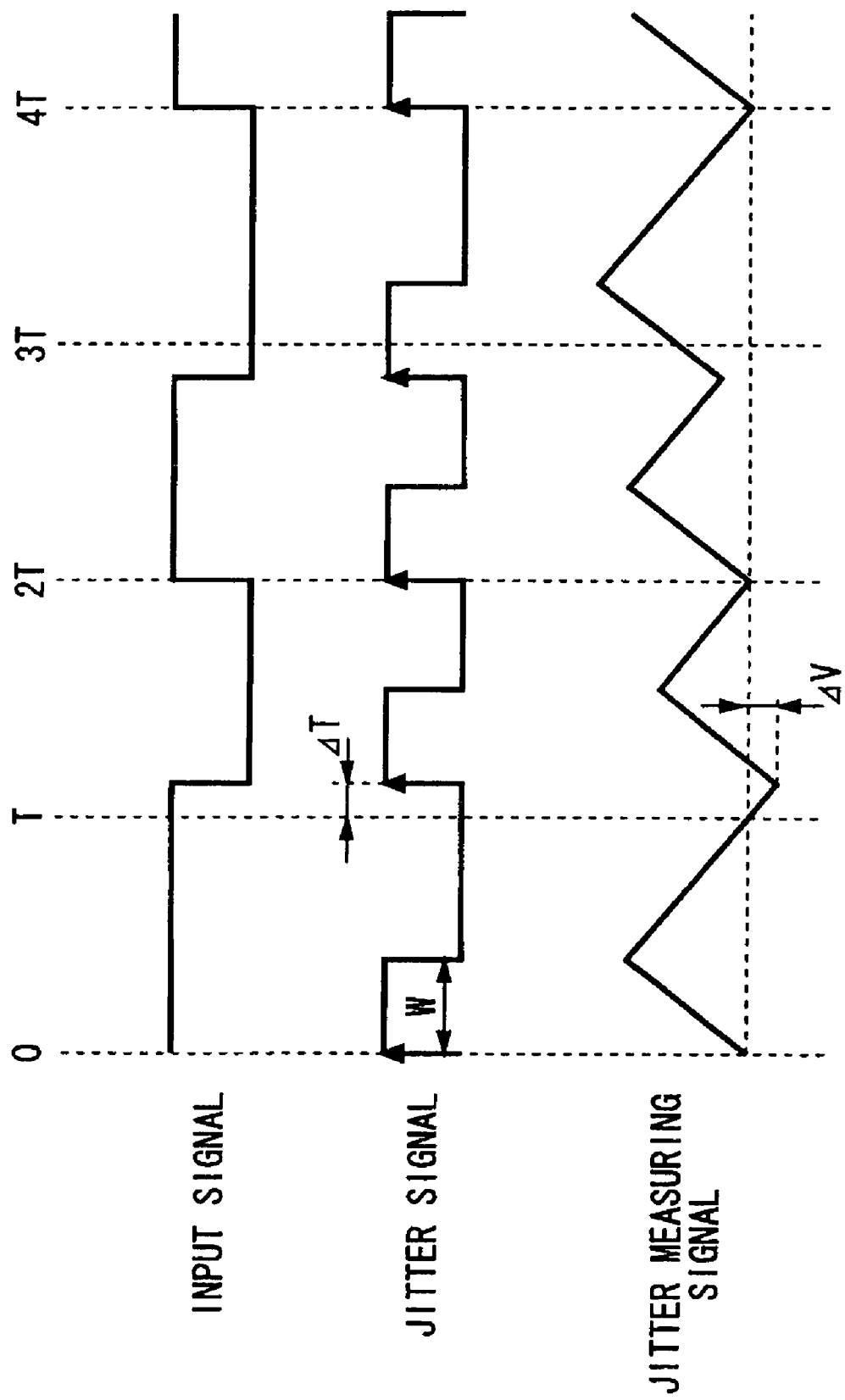
FIG. 3 is a view exemplary showing a waveform of a jitter measuring signal output from an integrating section.

FIG. 3 is a view exemplary showing a waveform of a jitter measuring signal output from the integrating section 370. As described above, the integrating section 370 outputs a jitter measuring signal of which a signal levels increases at a predetermined increasing rate while the jitter signal shows High logic and of which the signal level decreases at a predetermined decreasing rate while the jitter signal shows Low logic.

The integrating section 370 previously adjusts current values of the source side current source 372 and the sink side current source 376 so that an extreme value of the jitter measuring signal becomes a predetermined level when the input signal does not have a jitter. For example, a current value is previously adjusted so that a minimum value becomes a substantially zero level and a maximum value becomes a constant level.

When an input signal having a timing jitter is given after this adjustment has been performed, the extreme value of the jitter measuring signal has a difference ΔV according to a jitter amount ΔT for this predetermined level as shown in FIG. 3. That is to say, the jitter measuring signal shows a signal level according to the jitter amount included in the input signal. It is possible to compute a timing jitter ΔT by dividing the difference ΔV by gain of the jitter measuring circuit 300.

Moreover, the integrating section 370 may further have a sampling and holding circuit that samples and holds the signal level of the jitter measuring signal at a predetermined timing. The sampling and holding circuit may pass and output the jitter measuring signal while the signal output from the jitter signal generating section 330 shows High logic, and may hold and output the signal level of the jitter measuring signal while the signal output from the jitter signal generating section 330 shows Low logic.

Figures 4A, 4B:
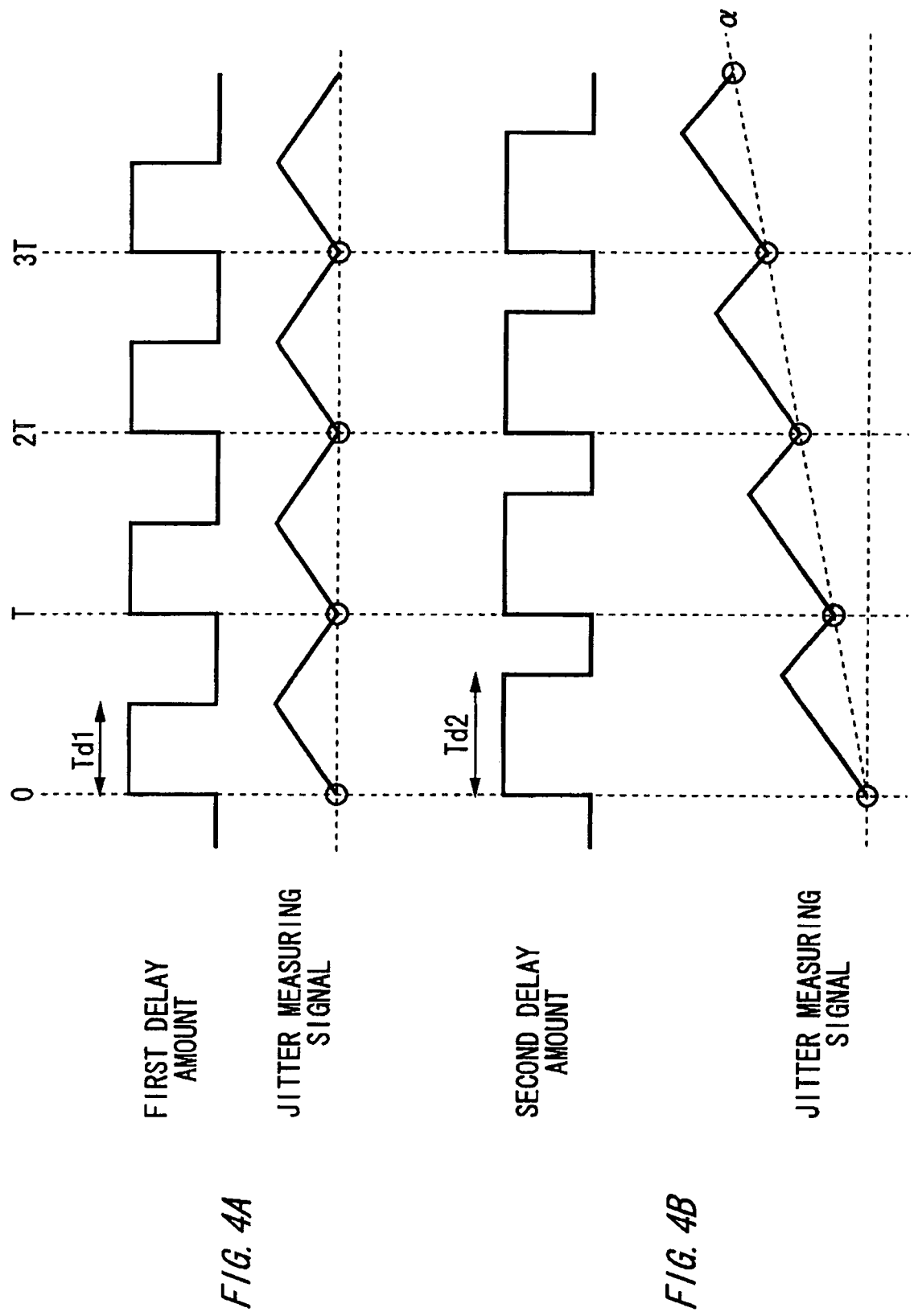
FIG. 4A is a view exemplary showing a jitter signal and a jitter measuring signal when a first delay amount Td1 is set in a variable delay circuit.
FIG. 4B is a view exemplary showing a jitter signal and a jitter measuring signal when a second delay amount Td2 is set in a variable delay circuit.

FIG. 4A is a view exemplary showing a jitter signal and a jitter measuring signal when a first delay amount Td1 is set in the variable delay circuit 332. Moreover, FIG. 4B is a view exemplary showing a jitter signal and a jitter measuring signal when a second delay amount Td2 is set in the variable delay circuit 332. In addition, in regard to examples of FIGS. 4A and 4B, it will be described about when using an input signal with a substantially zero jitter.

Since a timing jitter in an input signal is substantially zero, timings of rising edges of the jitter signals shown in FIGS. 4A and 4B are substantially identical with ideal timings (0, T, 2T, . . . ). Moreover, a pulse width of each jitter signal is determined by the delay amounts Td1 and Td2 in the variable delay circuit 332.

As shown in FIGS. 4A and 4B, an inclination of an envelope curve of a jitter measuring signal varies according to the delay amount of the variable delay circuit 332. In addition, in order to simply perform the measurement in the present example, it will be described using the first delay amount Td1 in which a level of the jitter measuring signal becomes substantially constant, that is, the inclination of the envelope curve of the jitter measuring signal becomes substantially zero. In this case, current values of the source current source 372 and the sink current source 376 may be previously adjusted so that the inclination of the envelope curve of the jitter measuring signal when the first delay amount Td1 is set in the variable delay circuit 332 becomes substantially zero.

As shown in FIG. 4B, when the delay amount of the variable delay circuit 332 is changed from the first delay amount Td1 to the second delay amount Td2, the inclination of the envelope curve of the jitter measuring signal is changed to a. When the delay amount of the variable delay circuit 332 has been changed, a difference Td2−Td1 between the delay amounts corresponds to a jitter amount ΔT in FIG. 3. Then, the change of level of the jitter measuring signal corresponds to a difference ΔV in FIG. 3. For this reason, the gain computing section 50 can compute gain of the jitter measuring circuit 300 by dividing an increase (i.e., the inclination a of envelope curve) per a unit time of the level of the jitter measuring signal output from the jitter measuring circuit 300 for the second delay amount by the difference Td2−Td1 between the delay amounts.

Moreover, the calibration apparatus 100 in the present example supplies the delay setting signal from an outside of the semiconductor package 600 to the jitter measuring circuit 300, and measures the inclination of the jitter measuring signal output from the jitter measuring circuit 300 outside the semiconductor package 600. Signal waveforms for these signals are not degraded, even if these signals are transmitted via the semiconductor package 600 because these signals are not a high-frequency signal. For this reason, it is possible to measure gain of the jitter measuring circuit 300 with high precision.

Moreover, according to the calibration apparatus 100 in the present example, although an absolute value of a period of an input signal and timings (0, T, 2T, . . . ) of ideal edges are unknown, it is possible to obtain jitter output gain of the jitter measuring circuit 300.

Moreover, as shown in FIGS. 4A and 4B, an envelope curve of a jitter measuring signal may be a straight line obtained by approximately linking vertices of the edges of the jitter measuring signal, or may be a straight line obtained by approximately linking peaks of the jitter measuring signal.

Moreover, in this example, it has been described about an input signal without a jitter. However, although the input signal has a jitter, a random component of the jitter does not affect an inclination of an envelope curve when it is measured for a period for which positive and negative components of the random component are adequately canceled.

Moreover, since it is considered that determinate components of jitters in input signals are substantially equal, it is possible to reduce an influence by a determinate component of a jitter by obtaining a difference between inclinations of envelope curves of the jitter measuring signals. By such an operation, it is possible to obtain jitter output gain in the jitter measuring circuit 300 with high precision.

Figure 5:
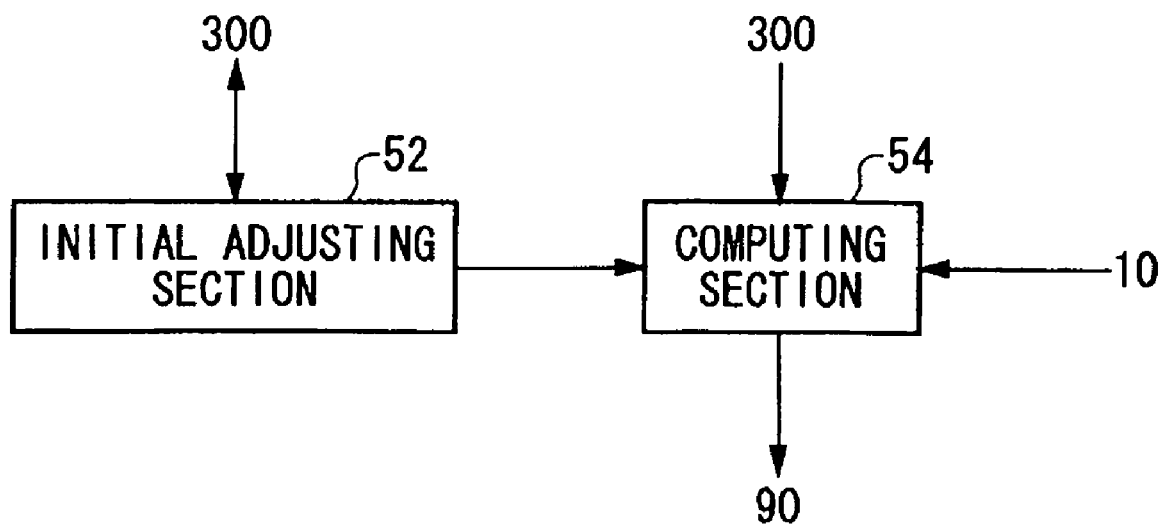
FIG. 5 is a view exemplary showing a configuration of a gain computing section.

FIG. 5 is a view exemplary showing a configuration of the gain computing section 50. As described in FIGS. 4A and 4B, the gain computing section 50 in the present example may adjust the jitter measuring circuit 300 so that the level of the jitter measuring signal corresponding to the first delay amount becomes substantially constant.

The gain computing section 50 has an initial adjusting section 52 and a computing section 54. When the first delay amount is set, the initial adjusting section 52 adjusts the jitter measuring circuit 300 so that levels of a maximum value and a minimum value of the jitter measuring signal become substantially constant.

For example, the initial adjusting section 52 may adjust current values of the source current source 372 and the sink current source 376 in the jitter measuring circuit 300. Moreover, the adjusting section 90 described in FIG. 1 may further function as the initial adjusting section 52.

The computing section 54 computes jitter output gain in the jitter measuring circuit 300 based on the inclination of the envelope curve of the jitter measuring signal when the second delay amount has been set in the jitter measuring circuit 300 adjusted by the initial adjusting section 52 and the difference between the first delay amount and the second delay amount. The computing section 54 may compute jitter output gain by means of the method described in FIGS. 1 to 4.

Moreover, the initial adjusting section 52 may inform the computing section 54 of the effect that the adjustment for the jitter measuring circuit 300 has been terminated. Moreover, the computing section 54 may inform the adjusting section 90 of the computed jitter output gain.

Figure 6:
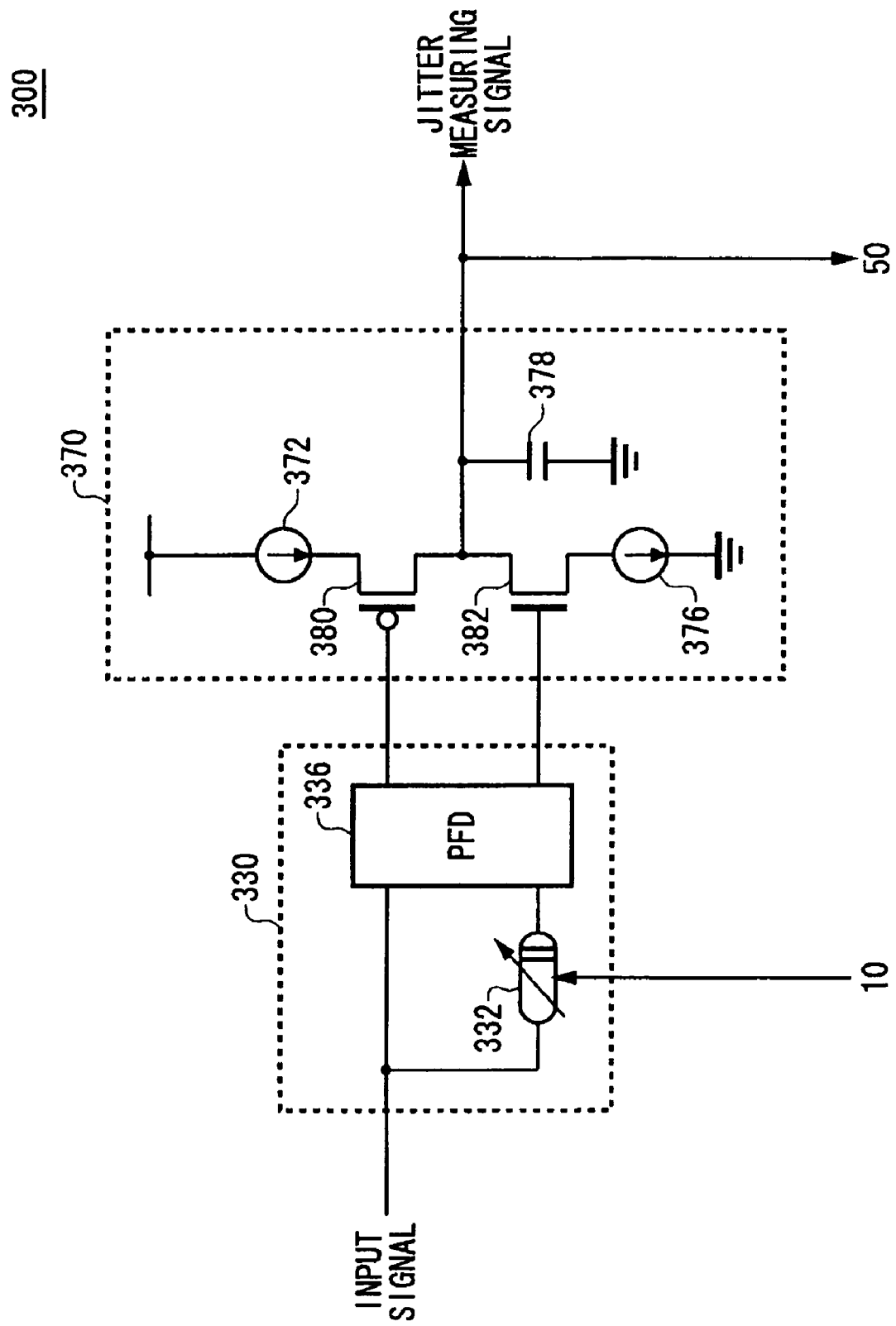
FIG. 6 is a view showing another example of a configuration of a jitter measuring circuit.

FIG. 6 is a view showing another example of a configuration of a jitter measuring circuit 300. The jitter signal generating section 330 in the present example has a variable delay circuit 332 and a phase frequency detector 336. In this example, the delay control section 10 may set a delay amount substantially equal to one period of an input signal in the variable delay circuit 332 as the first delay amount.

The phase frequency detector 336 outputs a signal with a pulse width according to a phase difference between the corresponding edges in two given signals. When a delay amount in the variable delay circuit 332 is a delay amount substantially equal to one period of an input signal, the phase frequency detector 336 outputs a jitter signal to gate terminals of a charge control section 380 and a discharge control section 382. Here, the jitter signal has a pulse width according to a phase difference between a phase of each edge of the input signal and a phase of an edge in a period prior to this edge.

The integrating section 370 in the present example has a source side current source 372, a sink side current source 376, a capacitor 378, the charge control section 380, and the discharge control section 382. The source side current source 372, the sink side current source 376, and the capacitor 378 have functions similar to those of the components with the same reference numerals in FIG. 2.

The charge control section 380 switches whether the capacitor 378 is charged by the source side current source 372 according to the jitter signal. Moreover, the discharge control section 382 switches whether the capacitor 378 is discharged by the sink side current source 376 according to the jitter signal.

The charge control section 380 and the discharge control section 382 are, e.g., FET and have polarities different from each other. For example, the charge control section 380 and the discharge control section 382 receive the jitter signal through gate terminals, the charge control section 380 charges the capacitor 378 when the jitter signal shows Low logic, and the discharge control section 382 discharges the capacitor 378 when the jitter signal shows High logic.

By such a configuration, it is possible to generate a jitter measuring signal obtained by demodulating a jitter in an input signal. In addition, the jitter measuring circuit 300 may be a configuration obtained by combining the jitter signal generating section 330 shown in FIG. 2 and the integrating section 370 shown in FIG. 6, or may be a configuration obtained by combining the jitter signal generating section 330 shown in FIG. 6 and the integrating section 370 shown in FIG. 2.

Figure 7:
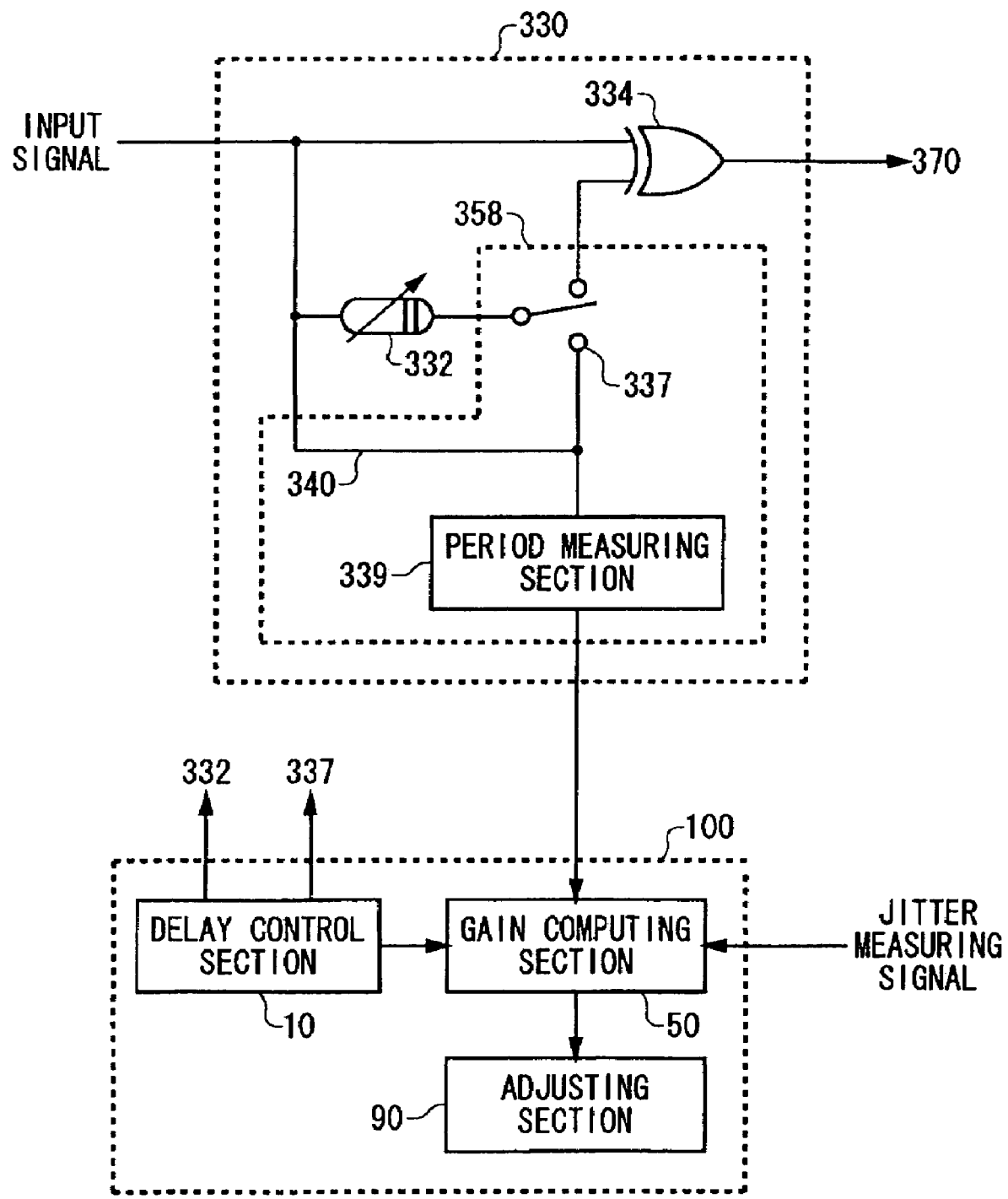
FIG. 7 is a view showing another example of a configuration of a jitter signal generating section.

FIG. 7 is a view showing another example of a configuration of a jitter signal generating section 330. The jitter signal generating section 330 in the present example further has a delay measuring circuit 358 in addition to a configuration of the jitter signal generating section 330 shown in FIG. 2.

The delay measuring circuit 358 is a circuit that measures a delay amount of the variable delay circuit 332, and is provided inside the semiconductor package 600. The delay measuring circuit 358 in the present example has a switch 337, a looping section 340, and a period measuring section 339.

The looping section 340 loops a delay signal output from the variable delay circuit 332 to an input port of the variable delay circuit 332 to generate an oscillation signal. The switch 337 selects whether the delay signal output from the variable delay circuit 332 is supplied to the looping section 340 or not the exclusive OR circuit 334. For example, the switch 337 selects the looping section 340 when measuring the delay amount of the variable delay circuit 332 and selects the exclusive OR circuit 334 when measuring the jitter in the input signal.

The period measuring section 339 measures a period of the oscillation signal from the looping section 340. For example, the period measuring section 339 may be a counter that counts the number of pulses transmitting the looping section 340. In this case, it is possible to measure a period of an oscillation signal by dividing a period for which the number of pulses is counted by a counted value by the period measuring section 339.

The gain computing section 50 receives the counted value by the period measuring section 339 from the outside of the semiconductor package 600, and computes the delay amount in the variable delay circuit 332 based on this counted value. A period of an oscillation signal corresponds to a sum of a delay amount in the variable delay circuit 332 and a delay amount in the looping section 340. For this reason, when the delay amount in the looping section 340 is known, it is possible to obtain the delay amount in the variable delay circuit 332. The gain computing section 50 may be previously supplied with the delay amount in the looping section 340, or may compute the delay amount in the variable delay circuit 332 assuming that the delay amount in the looping section 340 is zero. Moreover, the delay amount in the looping section 340 may be unknown. A calibration method of the present invention is a method for computing jitter output gain based on a difference between the first delay amount and the second delay amount, and thus it is preferable to obtain the difference between the delay amounts. For this reason, when the first delay setting signal and the second delay setting signal have the same delay amount in the looping section 340, it is possible to obtain the difference between the first delay amount and the second delay amount with high precision.

Moreover, the delay control section 10 may control the switch 337. For example, the delay control section 10 may sequentially output the first delay setting signal and the second delay setting signal in a state where the looping section 340 is selected by the switch 337. Moreover, the delay control section 10 informs the gain computing section 50 of the effect that the first delay setting signal and the second delay setting signal have been set. When the gain computing section 50 has been informed of the effect that the first delay setting signal has been set, the gain computing section 50 may initialize the counted value by the period measuring section 339 and acquire a counted value by the period measuring section 339 when a predetermined time has been passed. When this counted value has been acquired, the gain computing section 50 may inform the delay control section 10 of that effect.

When receiving this notice, the delay control section 10 sets the second delay setting signal in the variable delay circuit 332. When the gain computing section 50 has been informed of the effect that the second delay setting signal has been set, the gain computing section 50 may initialize the counted value by the period measuring section 339 and acquire a counted value by the period measuring section 339 when a predetermined time has been passed.

The counted value by the period measuring section 339 can be also received via the semiconductor package 600 with high precision. For this reason, it is possible to detect a delay amount in the variable delay circuit 332 with high precision when the first delay setting signal and the second delay setting signal have been set. For this reason, it is possible to compute gain of the jitter measuring circuit 300 with high precision.

Figure 8:
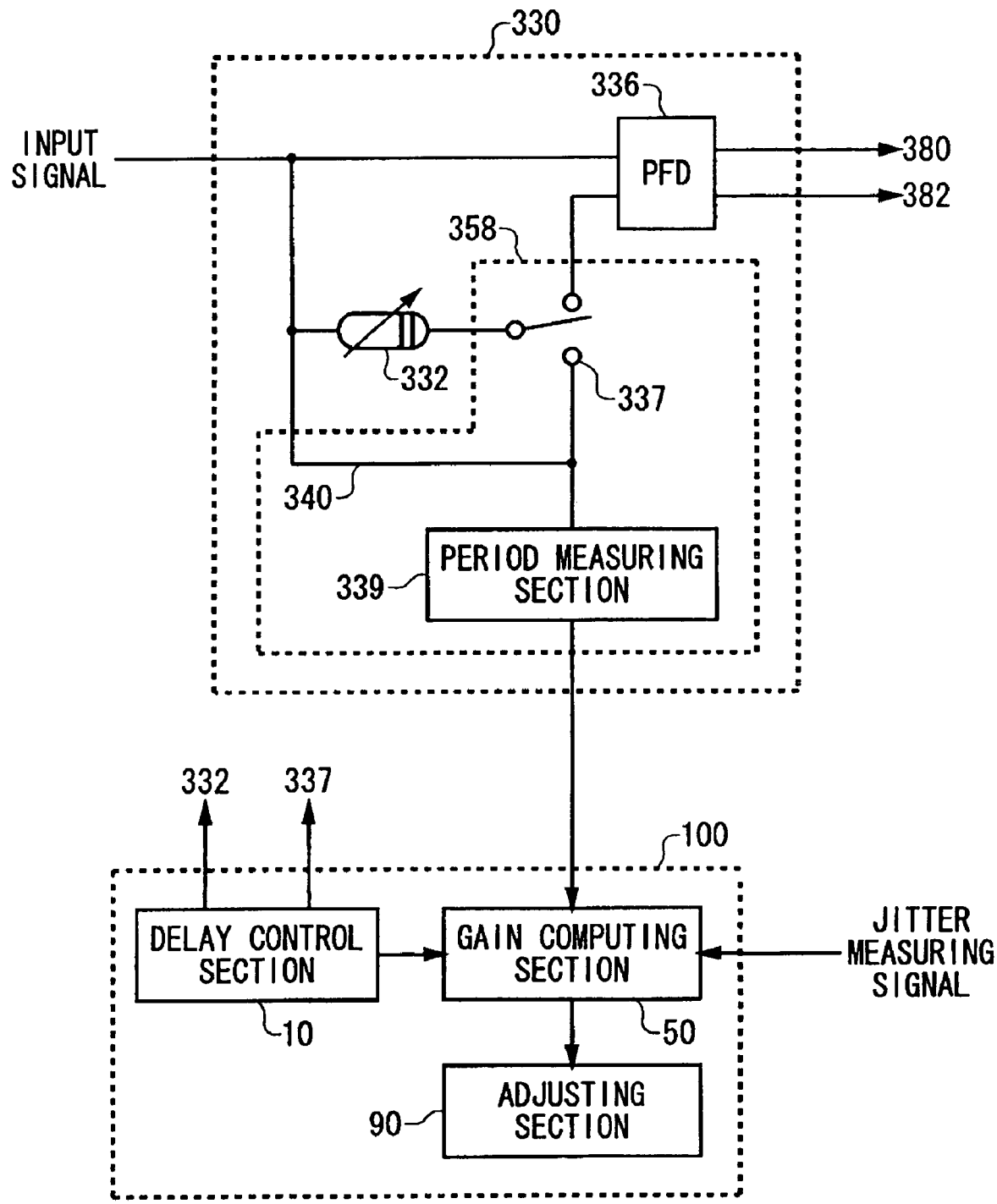
FIG. 8 is a view showing another example of a configuration of a jitter signal generating section.

FIG. 8 is a view showing another example of a configuration of a jitter signal generating section 330. The jitter signal generating section 330 in the present example further has a delay measuring circuit 358 in addition to a configuration of the jitter signal generating section 330 shown in FIG. 6. The delay measuring circuit 358 is equal to the delay measuring circuit 358 shown in FIG. 7.

In addition, the switch 337 in the present example selects whether a delay signal output from the variable delay circuit 332 is supplied to the looping section 340 or not the phase frequency detector 336. For example, the switch 337 selects the looping section 340 when measuring the delay amount in the variable delay circuit 332 and selects the phase frequency detector 336 when measuring the jitter in the input signal.

Even in such a configuration, it is possible to detect a delay amount in the variable delay circuit 332 with high precision. For this reason, it is possible to compute gain of the jitter measuring circuit 300 with high precision.

Figure 9:
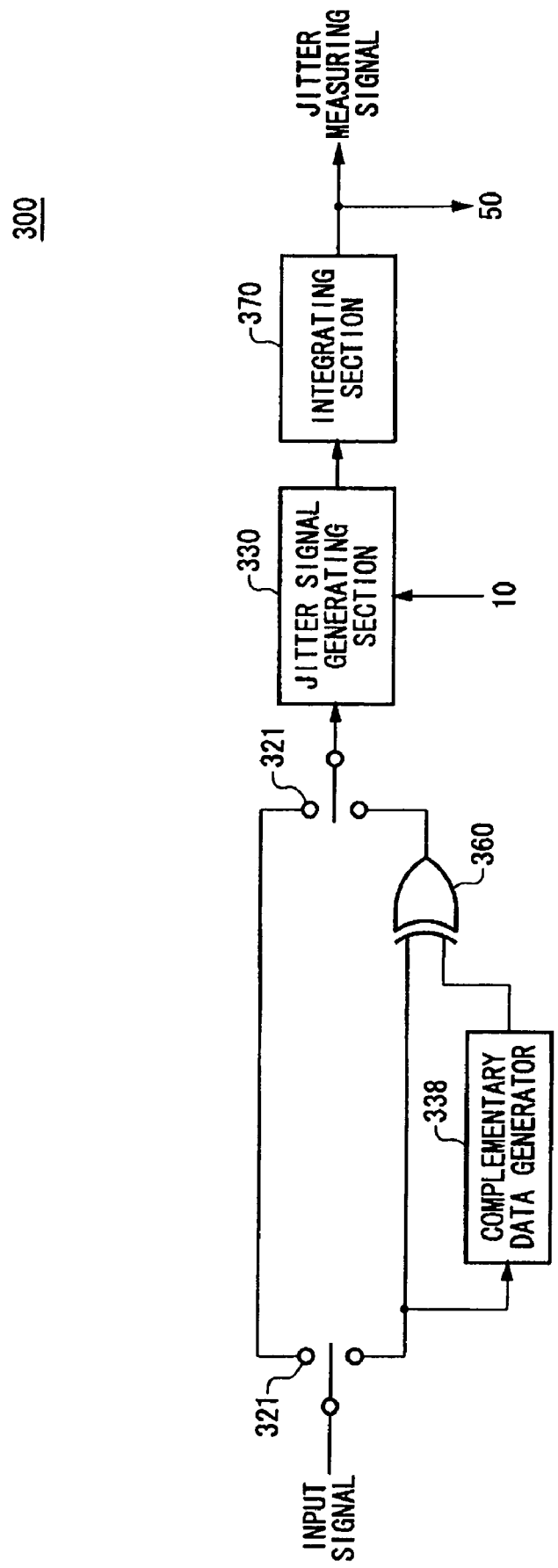
FIG. 9 is a view showing another example of a configuration of a jitter measuring circuit.

FIG. 9 is a view showing another example of a configuration of a jitter measuring circuit 300. In the present example, an input signal is a data signal, and the jitter measuring circuit 300 demodulates a jitter in this data signal. The jitter measuring circuit 300 in the present example has a complementary data generator 338, an exclusive OR circuit 360, and a switch 321 in addition to a configuration of the jitter measuring circuit 300 described in FIG. 1 to 8.

The complementary data generator 338 generates a complementary data signal of which a data value transits at a bit boundary at which a data value of a data signal does not transit. Examples of an operation and a configuration of the complementary data generator 338 are described below in FIGS. 10 and 11.

The exclusive OR circuit 360 outputs an exclusive OR of a data signal and a complementary data signal. Since a data value of a complementary data generating signal transits at a bit boundary at which a data value of a data signal does not transit, an exclusive OR of the complementary data generating signal and the data signal becomes a clock signal having an edge at each bit boundary of the data signal.

Here, a clock signal is a signal having an edge in a substantially constant period, and a data signal is a signal that does not necessarily have an edge in a substantially constant period.

The switch 321 selects either of the input signal or the signal output from the exclusive OR circuit 360 to input the selected signal into the jitter signal generating section 330. For example, the switch 321 selects the signal output from the exclusive OR circuit 360 when the input signal is a data signal and selects the input signal when the input signal is a clock signal, in order to input the selected signal into the jitter signal generating section 330.

By such a configuration, the jitter measuring circuit 300 can measure a jitter in a data signal. Moreover, even in case of the jitter measuring circuit 300 in the present example, the calibration apparatus 100 can compute gain of the integrating section 370 as described with reference to FIGS. 1 to 8.

Figure 10:
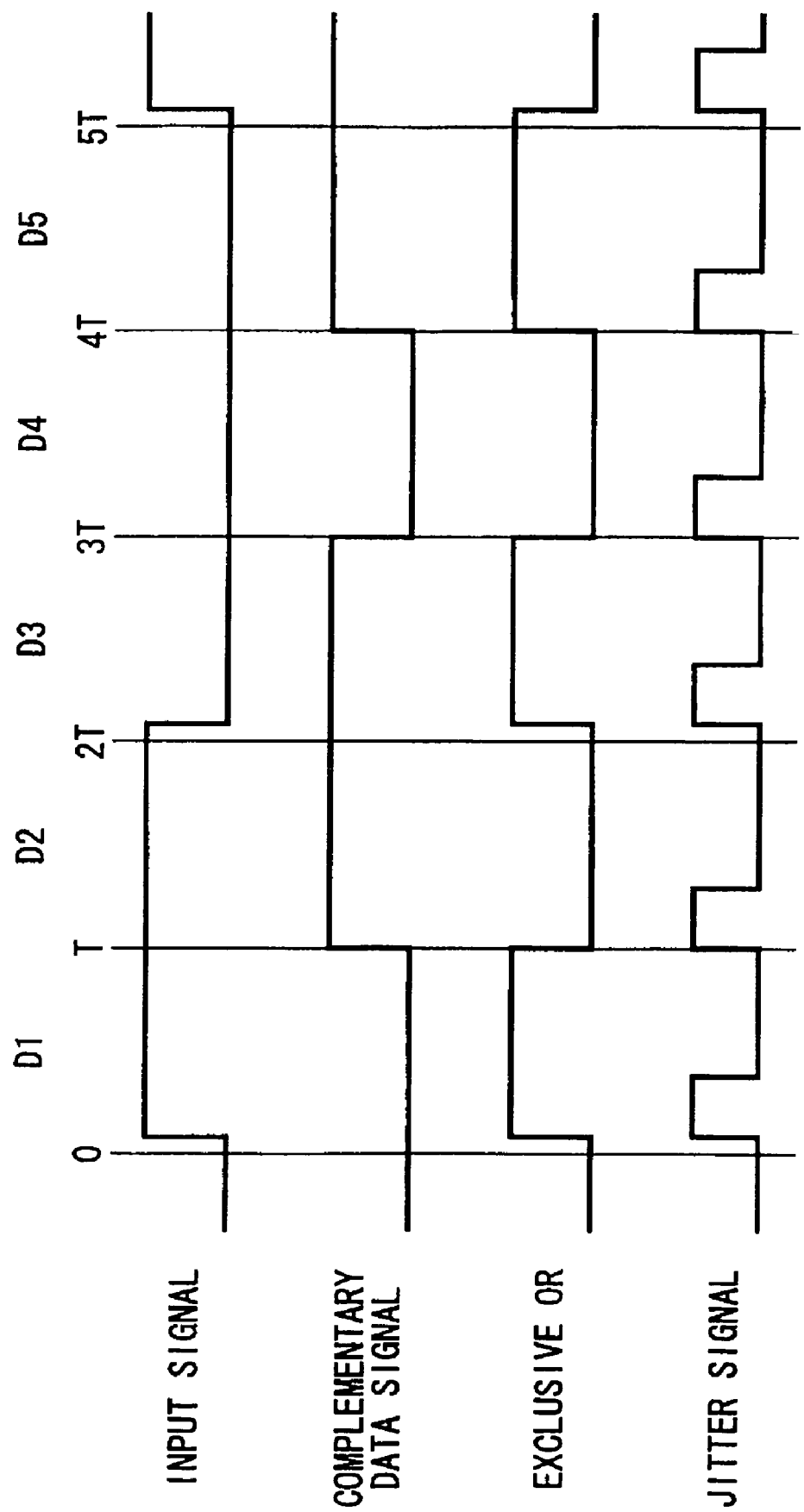
FIG. 10 is a timing chart exemplary showing an operation of a complementary data generator.

FIG. 10 is a timing chart exemplary showing an operation of the complementary data generator 338. The complementary data generator 338 receives an input signal (a data signal), and generates a complementary data signal for the input signal. A complementary data signal is a signal of which edges are provided on condition that a data value of an input signal does not transit at a boundary between data sections every boundary of the data sections in the input signal. For example, when an edge of the input signal and an edge of the complementary data signal are ranked on the same time base, the complementary data signal may be a signal in which these edges are arranged at the generally same time interval. Moreover, data section of an input signal means, e.g., a hold time of one data that is not continued in the serially-transmitted input signal. Moreover, data section of an input signal may mean a hold time of symbol data in the input signal that has multiple values and is transmitted. In other words, data section may be an interval between bits of the input signal, or may be an interval between symbols. For example, in FIG. 10, data section of an input signal is T, and a data pattern for the time (0-6T) is 110001.

In an example shown in FIG. 10, sections (0–T, T–2T, 3T–4T, . . . ) correspond to data sections (D1, D2, D3, . . . ). Moreover, boundaries between these data sections are (0, T, 2T, 3T, . . . ). In the present example, the data value of input signal transits at boundaries (0, 2T, 5T) between the data sections, and the data value of input signal does not transit at boundaries (T, 3T, 4T) between the data sections. For this reason, the complementary data generator 338 generates a complementary data signal having edges at the boundaries (T, 3T, 4T) between the data sections at which the input signal does not have edges.

Since the input signal has a substantially constant data section, timings of edges of the input signal are the generally same as either of timings (0, T, 2T, . . . ). In this case, it is preferable that the complementary data generator 338 generates a complementary data signal having an edge at a boundary between the data sections not having the edges of the input signal. In this way, considering both-side edges of the input signal and the complementary data signal, the edges are arranged at a substantially constant interval. By such an operation, the jitter measuring circuit 300 can operate at a substantially constant interval, and can reduce the output variation by a difference of an operation interval to demodulate a jitter with high precision.

The exclusive OR circuit 360 outputs an exclusive OR of the input signal and the complementary data signal. In this way, it is possible to generate a signal of which edges are arranged at a substantially constant interval. Then, a jitter component in the input signal is preserved in this signal.

Figure 11:
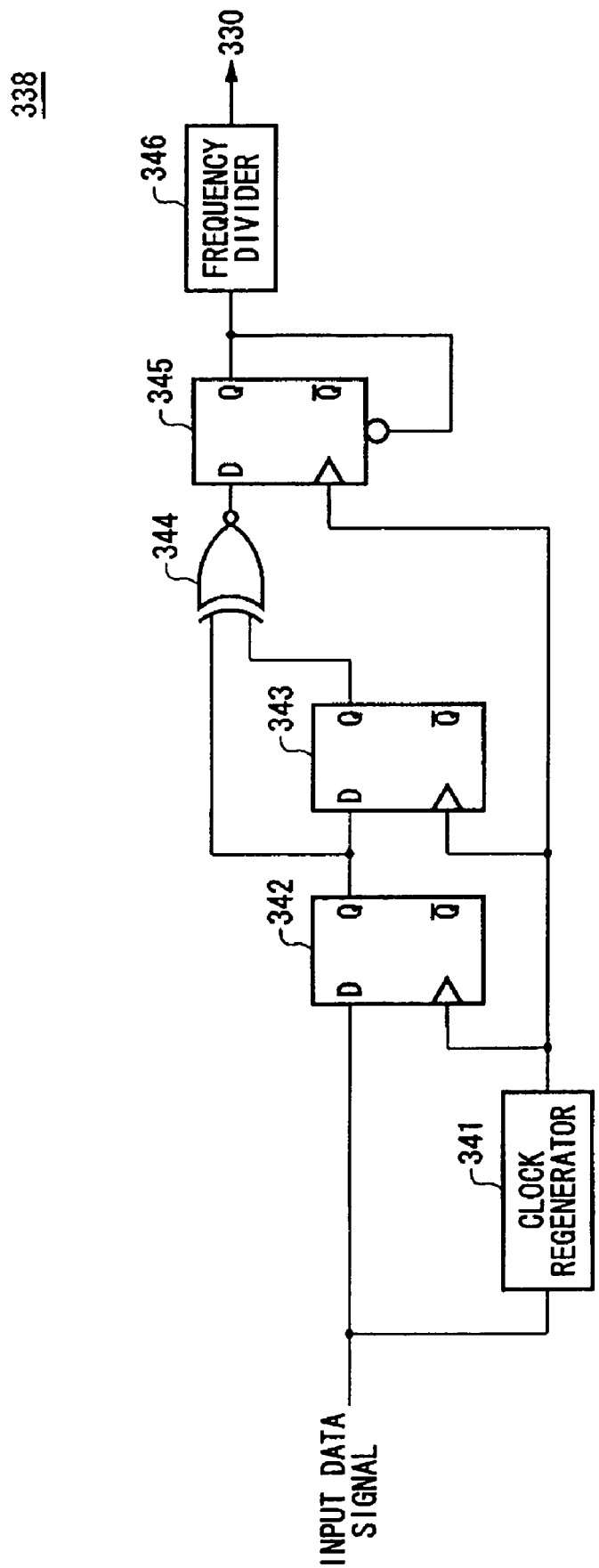
FIG. 11 is a view exemplary showing a configuration of a complementary data generator.

FIG. 11 is a view exemplary showing a configuration of the complementary data generator 338. The complementary data generator 338 in the present example has a clock regenerator 341, a first D flip-flop 342, a second D flip-flop 343, an accordance detector 344, a third D flip-flop 345, and a frequency divider 346.

The clock regenerator 341 generates a clock signal having a period substantially equal to the data section of input signal based on the input signal. The first D flip-flop 342 acquires the input signal according to this clock signal, and outputs the acquired signal.

The second D flip-flop 343 acquires the signal output from the first D flip-flop 342 according to this clock signal, and outputs the acquired signal. In other words, the second D flip-flop 343 delays the signal output from the first D flip-flop 342 by one period of the data section of the input signal, and outputs the delayed signal.

The accordance detector 344 outputs an accordance signal showing High logic when a signal value output from the first D flip-flop 342 and a signal value output from the second D flip-flop 343 are identical with each other.

The third D flip-flop 345 acquires the signal output from the accordance detector 344 according to this clock signal and outputs the acquired signal, and inside data are reset by this output signal. In other words, if the signal received from the accordance detector 344 shows High logic when the third D flip-flop 345 receives a rising edge of this clock signal, the third D flip-flop 345 outputs a pulse with a fine pulse width shorter than the data section of input signal.

The frequency divider 346 divides the frequency of signal output from the third D flip-flop 345 by two, and generates a complementary data signal. Here, dividing frequency by two means generating a signal of which a logical value transits according to either of a rising edge or a falling edge of the signal output from the third D flip-flop 345.

By such a configuration, it is possible to easily generate a complementary data signal of an input signal. Moreover, a configuration of the complementary data generator 338 is not limited to this configuration example. The complementary data generator 338 can have various configurations. For example, the complementary data generator 338 may obtain and output a clock signal by an operation based on digital data obtained by sampling the input signal.

Figure 12:
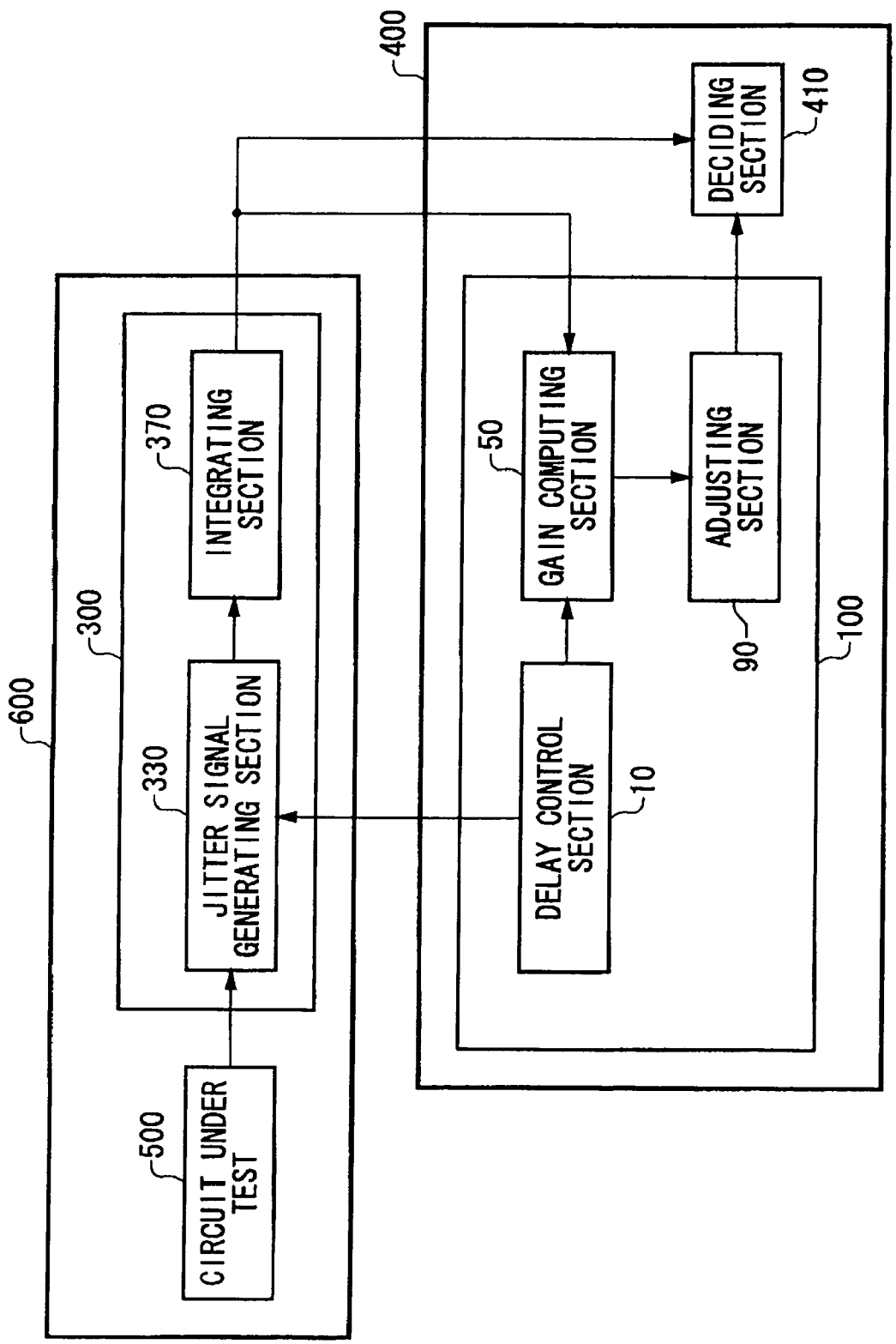
FIG. 12 is a view exemplary showing a configuration of a testing apparatus according to an embodiment of the present invention.

FIG. 12 is a view exemplary showing a configuration of a testing apparatus 400 according to an embodiment of the present invention. The testing apparatus 400 is an apparatus for testing a circuit under test 500 such as a semiconductor circuit, and includes a calibration apparatus 100 and a deciding section 410. Moreover, the circuit under test 500 is provided inside the semiconductor package 600 equal to the jitter measuring circuit 300.

The testing apparatus 400 includes the calibration apparatus 100 and the deciding section 410. The jitter measuring circuit 300 and the calibration apparatus 100 are equal to the jitter measuring circuit 300 and the calibration apparatus 100 described in FIGS. 1 to 11.

The calibration apparatus 100 previously measures gain of the jitter measuring circuit 300. When measuring gain of the jitter measuring circuit 300, the calibration apparatus 100 may make the circuit under test 500 output a signal without a jitter. Moreover, when a signal generating apparatus for outputting a signal without a jitter is provided inside the semiconductor package 600, the calibration apparatus 100 may input the signal without a jitter from this signal generating apparatus into the jitter measuring circuit 300, in order to compute gain of the jitter measuring circuit 300.

After the calibration apparatus 100 has computed the gain of the jitter measuring circuit 300, the jitter measuring circuit 300 outputs a jitter measuring signal according to a jitter of a measured signal output from the circuit under test 500.

The deciding section 410 decides the good or bad of the circuit under test 500 based on the jitter measuring signal output from the jitter measuring circuit 300. For example, the deciding section 410 may compute the jitter of the measured signal by dividing a level of the jitter measuring signal by the gain informed from the adjusting section 90. The deciding section 410 may decide the good or bad of the circuit under test 500 according to whether the jitter of the measured signal is larger than a predetermined value.

As described above, although the jitter measuring circuit 300 is provided inside the semiconductor package 600, the calibration apparatus 100 can compute jitter output gain of the jitter measuring circuit 300 with high precision. For this reason, it is possible to decide the good or bad of the circuit under test 500 with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A calibration apparatus that calibrates a jitter measuring circuit, the calibration apparatus comprising:
a delay control section that sequentially sets a first delay amount and a second delay amount in a variable delay circuit included in the jitter measuring circuit, the jitter measuring circuit outputting a jitter measuring signal with a level according to an amount of jitter in an input signal based on the input signal and a delay signal obtained by delaying the input signal by means of the variable delay circuit; and
a gain computing section that computes a ratio of a signal level of the jitter measuring signal to a jitter amount included in an input signal for the jitter measuring circuit based on the jitter measuring signal respectively output from the jitter measuring circuit for the first delay amount and the second delay amount.

2. The calibration apparatus as claimed in claim 1, wherein the gain computing section computes the ratio of a signal level of the jitter measuring signal to a jitter amount included in an input signal for the jitter measuring circuit based on a ratio between a difference between the first delay amount and the second delay amount and a difference between the levels of the jitter measuring signals.

3. The calibration apparatus as claimed in claim 1, wherein the delay control section sets the jitter measuring circuit so that the level of the jitter measuring signal output from the jitter measuring circuit for the first delay amount is substantially constant, and
the gain computing section computes the ratio of a signal level of the jitter measuring signal to a jitter amount included in an input signal for the jitter measuring circuit based on a change amount per a unit time of the level of the jitter measuring signal output from the jitter measuring circuit for the second delay amount and the difference between the first delay amount and the second delay amount.

4. The calibration apparatus as claimed in claim 1, wherein the jitter measuring circuit comprises:
a jitter signal generating section that generates a jitter signal whose duration of at least one of High logic and Low logic changes according to a jitter in the input signal based on the input signal and the delay signal; and
an integrating section that integrates the jitter signal and outputs the jitter measuring signal with the level according to the amount of jitter in the input signal, and
the calibration apparatus computes gain in the integrating section.

5. The calibration apparatus as claimed in claim 2, wherein the delay control section sequentially supplies a first delay setting signal for setting the first delay amount in the variable delay circuit and a second delay setting signal for setting the second delay amount in the variable delay circuit to the variable delay circuit, and
the gain computing section detects the first delay amount when the first delay setting signal has been supplied and the second delay amount when the second delay setting signal has been supplied.

6. A calibration apparatus that calibrates a jitter measuring circuit for outputting a jitter measuring signal with a level according to an amount of jitter in an input signal based on the input signal and a delay signal obtained by delaying the input signal by means of a variable delay circuit, the calibration apparatus comprising:
a delay control section that sequentially sets a first delay amount and a second delay amount in the variable delay circuit; and
a gain computing section that computes gain in the jitter measuring circuit based on a change amount per a unit time of the level of the jitter measuring signal output from the jitter measuring circuit for the second delay amount and a difference between the first delay amount and the second delay amount,
wherein
the delay control section sets the jitter measuring circuit so that the level of the jitter measuring signal output from the jitter measuring circuit for the first delay amount is substantially constant,
the jitter measuring circuit comprises a delay measuring circuit that measures a delay amount of the variable delay circuit and is formed inside a semiconductor package,
the delay control section supplies the first delay setting signal and the second delay setting signal from an outside of the semiconductor package to the variable delay circuit, and
the gain computing section receives delay measurement signals showing the first delay amount and the second delay amount measured by the measuring circuit from the semiconductor package.

7. The calibration apparatus as claimed in claim 6, wherein the delay measuring circuit comprises a looping section that loops the delay signal output from the variable delay circuit to an input port of the variable delay circuit to generate an oscillation signal and a period measuring section that measures a period of the oscillation signal,
the delay control section supplies, from the outside of the semiconductor package to the looping section, a signal that causes the looping section to sequentially generate a first oscillation signal obtained by looping the delay signal output from the variable delay circuit controlled by the first delay setting signal and a second oscillation signal obtained by looping the delay signal output from the variable delay circuit controlled by the second delay setting signal, and the gain computing section receives a period of the first oscillation signal measured by the period measuring section and the delay measurement signal showing a period of the second oscillation signal from the outside of the semiconductor package.

8. A calibration method for calibrating a jitter measuring circuit, the calibration method comprising:

sequentially setting a first delay amount and a second delay amount in a variable delay circuit included in the jitter measuring circuit, the jitter measuring circuit outputting a jitter measuring signal with a level according to an amount of jitter in an input signal based on the input signal and a delay signal obtained by delaying the input signal by means of the variable delay circuit; and computing a ratio of a signal level of the jitter measuring signal to a jitter amount included in an input signal for the jitter measuring circuit based on the jitter measuring signal respectively output from the jitter measuring circuit for the first delay amount and the second delay amount.

\* \* \* \* \*